(12) United States Patent
Koen et al.

(10) Patent No.: US 7,135,920 B2
(45) Date of Patent: Nov. 14, 2006

(54) METHOD AND CIRCUIT FOR FACILITATING CONTROL OF AC COUPLING IN AN AMPLIFIER CIRCUIT

(75) Inventors: Myron J. Koen, Tucson, AZ (US); Harish Venkataraman, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 165 days.

(21) Appl. No.: 10/925,634

(22) Filed: Aug. 24, 2004

(65) Prior Publication Data

US 2006/0044058 A1 Mar. 2, 2006

(51) Int. Cl.
*H03F 3/45* (2006.01)
(52) U.S. Cl. ............................................. 330/69
(58) Field of Classification Search .............. None
See application file for complete search history.

(56) References Cited

U.S. PATENT DOCUMENTS

| | | | |
|---|---|---|---|
| 4,275,358 A * | 6/1981 | Winget | 330/109 |
| 5,880,618 A | 3/1999 | Koen | |
| 6,229,375 B1 | 5/2001 | Koen | |
| 6,731,163 B1 * | 5/2004 | Huckins et al. | 330/69 |

OTHER PUBLICATIONS

Toumazou, C. et al., Extending voltage-mode op amps to current-mode performance, IEE Proceedings, vol. 137, Pt. G, No. 2, Apr. 1990, pp. 116-130.

* cited by examiner

*Primary Examiner*—Robert Pascal
*Assistant Examiner*—Krista Flanagan
(74) *Attorney, Agent, or Firm*—Carlton H. Hoel; W. James Brady; Frederick J. Telecky, Jr.

(57) ABSTRACT

A method and circuit for facilitating control of the AC coupling for addressing input offset in an amplifier circuit are provided. In accordance with an exemplary embodiment, a control circuit comprises a pair of resistive networks coupled together through a capacitive coupling, with the pair of resistive networks configured between two amplifier devices of the amplifier circuit. The capacitive coupling is configured to prevent offset in the differences between input voltages to the two amplifier devices, and can comprise various types and configurations of capacitor networks, devices and components. The pair of resistive networks is configured to generate an output current signal from the two amplifier devices while facilitating a substantially identical capacitive loading on the two amplifier devices.

13 Claims, 1 Drawing Sheet

METHOD AND CIRCUIT FOR FACILITATING CONTROL OF AC COUPLING IN AN AMPLIFIER CIRCUIT

FIELD OF THE INVENTION

This invention generally relates to amplifier circuits and more particularly to a method and circuit for facilitating control of the AC coupling for eliminating input offset in an amplifier circuit.

BACKGROUND OF THE INVENTION

Amplifiers are commonly used to provide gain to an input signal. For example, if a voltage amplifier has a voltage gain of 10, then an input signal of 50 millivolts ("mV") applied to the voltage amplifier results in an output signal of 500 mV. An amplifier typically has a range in which the amplifier operates in a linear manner. For example, a voltage amplifier connected to a 5-volt power supply may be linear for outputs up to 4.5 volts. However, driving output voltages greater than 4.5 volts may force the amplifier into non-linearity, resulting in overload of the amplifier and thus potential inaccuracy. In addition to linearity and noise concerns that can affect accuracy, many amplifier circuits can also be susceptible to input offset. For example, even an input offset of a few millivolts can greatly affect the accuracy of the amplifier circuit.

Many amplifier circuits, such as instrumentation amplifiers, generate a current signal between two amplifier devices through a direct connected resistor. For a direct connection between the amplifier devices, i.e., for DC coupling, such amplifier circuits can generally operate without difficulty. However, if the gain in the amplifier circuit is high, then large offset can occur to decrease accuracy of the amplifier circuit. To address large voltage offset, AC coupling is often implemented, such as through connecting a capacitor between the amplifier devices. In most instances, the capacitor is provided external to the integrated circuit chip containing the amplifier circuits. As a result of an additional bond pad that is utilized and the accumulated stray capacitance, mainly due to the need to configure the bond pad to allow for the connection of the external capacitor, the capacitive loading of the external wiring connections becomes unequal. When the capacitive loading becomes unequal, the ability to achieve low, even harmonic distortion becomes extremely difficult to obtain.

SUMMARY OF THE INVENTION

In accordance with various aspects of the present invention, a method and circuit for facilitating control of the AC coupling for eliminating input offset in an amplifier circuit are provided. By controlling the capacitive loading between amplifier devices of the amplifier circuit, the ability to control harmonic distortion can be improved.

In accordance with an exemplary embodiment, a control circuit comprises a pair of resistive networks coupled together through a capacitive coupling, with the pair of resistive networks configured between two amplifier devices of the amplifier circuit. The capacitive coupling is configured to prevent offset in the differences between input voltages to the two amplifier devices, and can comprise various types and configurations of capacitor networks, devices and components. The pair of resistive networks is configured to generate an output current signal from the two amplifier devices while facilitating a substantially identical capacitive loading from the capacitive coupling on the two amplifier devices.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION

The present invention will be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application in which control of AC coupling or capacitive coupling is desired. However, for purposes of illustration only, exemplary embodiments of the present invention will be described herein in connection with instrumentation amplifiers. Further, it should be noted that while various components may be suitably coupled or connected to other components within exemplary circuits, such connections and couplings can be realized by direct connection between components, or by connection through other components or devices located in between.

In accordance with various aspects of the present invention, a method and circuit for facilitating control of the AC coupling for addressing offset in an amplifier circuit are provided. By controlling the capacitive loading between amplifier devices of the amplifier circuit, the ability to control harmonic distortion can be improved.

Figure 1:
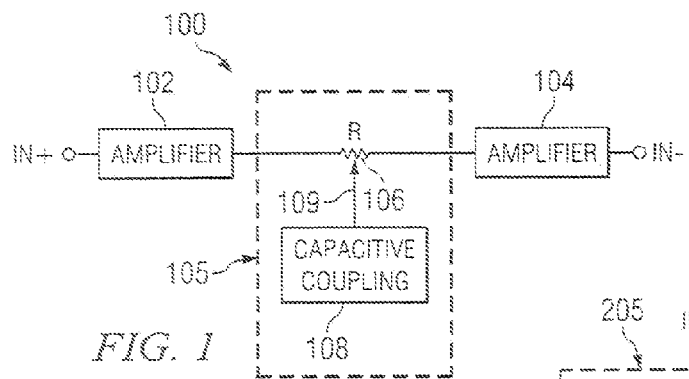
FIG. 1 is a block diagram of an exemplary amplifier circuit configured with a control circuit in accordance with an exemplary embodiment.
Figure 2:
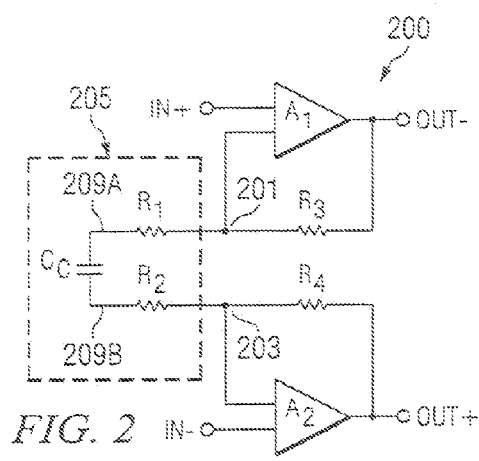
FIG. 2 is a schematic diagram of an exemplary amplifier circuit configured with a control circuit in accordance with an exemplary embodiment.

For example, with reference to FIG. 1, in accordance with an exemplary embodiment, an amplifier circuit 100 comprises a first amplifier device 102, a second amplifier device 104 and a control circuit 105. First amplifier device 102 and second amplifier device 104 can comprise various amplifier circuit configurations, such as instrumentation amplifiers, differential amplifiers or any other amplifier configuration. For example, with momentary reference to FIG. 2, an amplifier circuit 200 can comprise a first amplifier $A_1$ and a second amplifier $A_2$ configured in an instrumentation amplifier arrangement. However, amplifier circuit 100 can comprise any circuit configuration having AC coupling for addressing input offset between a pair of amplifier devices.

With reference again to FIG. 1, control circuit 105 comprises a resistive network 106 configured between two amplifier devices 102 and 104 of amplifier circuit 100, coupled together through an AC coupling comprising a capacitive coupling 108. Resistive network 106 is configured to generate an output current signal from amplifier devices 102 and 104. Capacitive coupling 108 is configured to prevent offset in the differences between input voltages IN⁺ and IN⁻ to two amplifier devices 102 and 104. Capacitive coupling 108 comprises an external capacitance coupled through external wiring 109, and can comprise various types and configurations of capacitor networks, devices and components.

Even with capacitive coupling comprising an external capacitance coupled to amplifier devices 102 and 104 through external wiring, control circuit 105 is configured through resistive network 106 to facilitate a substantially identical capacitive loading at terminals coupled to two amplifier devices 102 and 104. Resistive network 106 is configured to suitably balance the capacitive loading and comprises a pair of resistive networks coupled between amplifier devices 102 and 104, with capacitive coupling 108 configured in between the pair of resistive networks.

For example, in accordance with an exemplary embodiment, with reference again to FIG. 2, a control circuit 205 comprises a pair of feedback resistive networks $R_3$ and $R_4$, a pair of resistive networks $R_1$ and $R_2$ configured between first amplifier $A_1$ and second amplifier $A_2$, and a capacitive coupling $C_c$ configured in series between resistive networks $R_1$ and $R_2$, coupled by external wiring 209A and 209B. Resistive networks $R_1$ and $R_2$ are configured for facilitating a substantially identical capacitive loading at terminals 201 and 203 of first amplifier $A_1$ and second amplifier $A_2$. For example, external wiring 209A and 209B provide accumulated capacitance that can create unequal capacitive loading if both external wiring 209A and 209B are configured to connect a coupling capacitor between a single resistive network R and either first amplifier $A_1$ or second amplifier $A_2$; in the exemplary embodiment, external wiring 209A and 209B are configured to couple capacitive coupling $C_C$ in series between resistive networks $R_1$ and $R_2$. As a result, even with accumulated capacitance from external wiring 209A and 209B, resistive networks $R_1$ and $R_2$ can control the effective capacitive loading at terminals 201 and 203 of first amplifier $A_1$ or second amplifier $A_2$ to be substantially identical, i.e., in a balanced manner.

Resistive networks $R_1$ and $R_2$ can comprise various resistance sizes and values, and can be arranged in various configurations of smaller value resistors in series and/or parallel. In accordance with an exemplary embodiment, resistive networks $R_1$ and $R_2$ comprise substantially identical-sized resistive networks, i.e., having substantially the same resistance values, to facilitate a balancing of the capacitive loading. For substantially identical resistance values, resistive networks $R_1$ and $R_2$ may be configured with +/− approximately 10% or less differences in resistance value. In accordance with another exemplary embodiment, resistive networks $R_1$ and $R_2$ can comprise variable resistive devices configured to enable adjustment of the resistance values to facilitate balancing of the capacitive loading.

Figure 3:
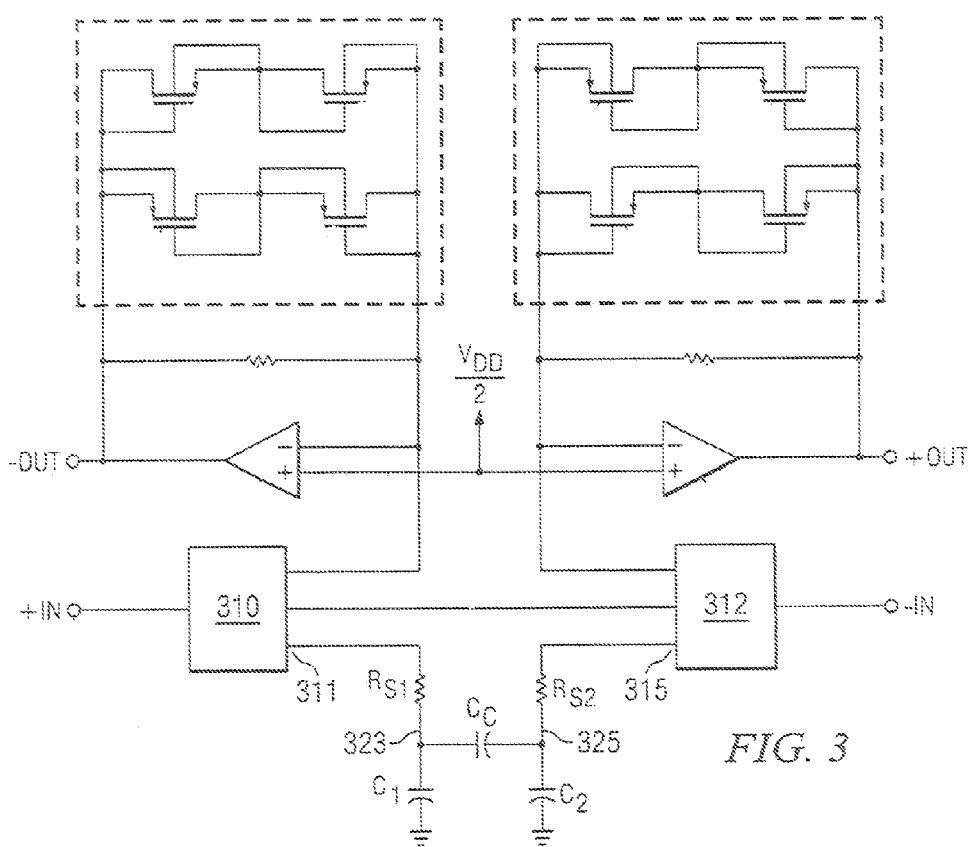
FIG. 3 is a schematic diagram of an exemplary amplifier circuit configured with a control circuit in accordance with another exemplary embodiment.

Control circuit 205 can be configured in various other amplifier circuit configurations in addition to amplifier circuits 100 and 200. For example, a control circuit can be configured with a precision amplifier circuit configured for fast recovery time as disclosed more fully in U.S. Pat. No. 6,642,795, issued on Nov. 4, 2003, and entitled "Fast Recovery Time Precision Amplifier", having common inventors and assignee as the present application, and hereby incorporated by reference. With reference to FIG. 3, in accordance with another exemplary embodiment, an amplifier circuit 300 can be configured with a control circuit configured between input amplifiers 310 and 312. In accordance with this exemplary embodiment, the control circuit comprises resistive networks $R_{S1}$ and $R_{S2}$ coupled to input amplifiers 310 and 312, with a capacitive coupling $C_C$ configured in series between resistive networks $R_1$ and $R_2$ through external wiring 323 and 325. Two capacitances, $C_1$ and $C_2$, are representative of the accumulated capacitance on external wiring 323 and 325, respectively. Resistive networks $R_{S1}$ and $R_{S2}$ are configured to suitably balance the capacitive loading at terminals 311 and 315 of input amplifiers 310 and 312. As a result of the configuration of resistive networks $R_{S1}$ and $R_{S2}$ and capacitive coupling $C_C$, the effective capacitive loading at terminals 311 and 315 is substantially identical, thereby facilitating the ability of amplifier 300 to achieve low, even harmonic distortion while addressing offset.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by suitably scaling the values of the resistor and capacitive devices within the control circuit. In addition, instead of providing a control circuit for controlling the AC coupling between only two amplifier devices, an exemplary control circuit can be configured for balancing the capacitive loading between more than two amplifier devices. These alternatives can be suitably selected depending upon the particular application or in consideration of any number of factors associated with the operation of the system. Moreover, these and other changes or modifications are intended to be included within the scope of the present invention, as expressed in the following claims.

We claim:

1. An amplifier circuit configured for substantially reduced even harmonic distortion, said amplifier circuit comprising:
   a first amplifier having a first terminal;
   a second amplifier having a second terminal;
   a control circuit configured between said first amplifier and said second amplifier, said control circuit comprises:
   a pair of resistive networks configured to balance capacitive loading at said first terminal and said second terminal; and
   a capacitive coupling configured between said first amplifier and said second amplifier to prevent offset in any differences between input voltages coupled to said first amplifier and said second amplifier;
   where said pair of resistive networks comprises a pair of resistive devices, and said capacitive coupling is configured in series between said pair of resistive devices.

2. The amplifier circuit according to claim 1, wherein said control circuit comprises a capacitive coupling configured between said first amplifier and said second amplifier to prevent offset in any differences between input voltages coupled to said first amplifier and said second amplifier.

3. The amplifier circuit according to claim 1, wherein said pair of resistive devices comprise substantially identical resistance values.

4. The amplifier circuit according to claim 1, wherein said pair of resistive devices comprise variable resistance devices.

5. The amplifier circuit according to claim 1, wherein said first amplifier and said second amplifier are configured in an instrumentation amplifier arrangement.

6. A control circuit configured to facilitate substantially reduced even harmonic distortion in an instrumentation amplifier circuit, said control circuit comprising:
   a pair of resistive networks configured to balance capacitive loading at terminals of the instrumentation amplifier circuit; and
   a capacitive coupling configured to prevent offset in any differences between input voltages coupled to amplifiers of the instrumentation amplifier circuit, said capacitive coupling configured for coupling between the amplifiers of the instrumentation amplifier circuit;
   wherein said pair of resistive networks comprises a pair of resistive devices, and capacitive coupling is configured in series between said pair of resistive devices.

7. The control circuit according to claim 6, wherein said pair of resistive networks comprise substantially identical resistance values.

8. The control circuit according to claim 6, wherein said pair of resistive devices comprise variable resistance devices.

9. A method of controlling the capacitive loading for a first amplifier and a second amplifier of an amplifier circuit, said method comprising:
   providing a pair of resistive networks within the first amplifier and the second amplifier of said amplifier circuit;
   externally coupling a capacitive network to said pair of resistive networks; and
   balancing said capacitive loading through said pair of resistive networks;
   wherein said balancing said capacitive loading further comprises providing substantially identical resistance values for said pair of resistive networks; and
   wherein said externally coupling a capacitive network comprise coupling said capacitive network in series between said pair of resistive networks.

10. An instrumentation amplifier circuit comprising:
    a first amplifier device having a first input terminal configured to provide a positive input terminal for said instrumentation amplifier circuit, and having a second input terminal;
    a second amplifier device having a first input terminal configured to provide a negative input terminal for said instrumentation amplifier circuit, and having a second input terminal; and
    a control circuit configured between said first amplifier device and said second amplifier device, said control circuit comprises:
    a pair of resistive networks configured to balance capacitive loading at said second terminals; and
    a capacitive coupling configured between said first amplifier and said second amplifier to prevent offset in any differences between input voltages coupled to said positive input terminal and said second input terminal;
    wherein said pair of resistive networks comprises a pair of resistive devices, and said capacitive coupling is configured in series between said pair of resistive devices.

11. The instrumentation amplifier circuit according to claim 10, wherein said control circuit comprises a capacitive coupling configured between said first amplifier device and said second amplifier device to prevent offset in any differences between input voltages coupled to said positive input terminal and said negative input terminal.

12. The instrumentation amplifier circuit according to claim 10, wherein said pair of resistive devices comprise substantially identical resistance values.

13. The amplifier circuit according to claim 10, wherein said pair of resistive devices comprise variable resistance devices.

\* \* \* \* \*